(12) United States Patent
Reschnar et al.

(10) Patent No.: US 6,829,824 B2
(45) Date of Patent: Dec. 14, 2004

(54) METHOD FOR PRODUCING A STRUCTURAL MEMBER FROM PLATES STACKED ON TOP OF EACH OTHER AND SOLDERED TOGETHER

(75) Inventors: Wilfried Reschnar, Schozach (DE); Stephan Borges, Ludwigsburg (DE); Stephan Leuthner, Stuttgart (DE); Juergen Hackenberg, Sachsenheim (DE); Franz Wetzl, Mundelsheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/276,190

(22) PCT Filed: Apr. 26, 2001

(86) PCT No.: PCT/DE01/01570
§ 371 (c)(1),
(2), (4) Date: May 8, 2003

(87) PCT Pub. No.: WO01/87529
PCT Pub. Date: Nov. 22, 2001

(65) Prior Publication Data
US 2003/0173065 A1 Sep. 18, 2003

(30) Foreign Application Priority Data
May 18, 2000 (DE) .......................................... 100 24 111

(51) Int. Cl.$^7$ .............................. B21D 53/02; B23K 5/22
(52) U.S. Cl. .............................. 29/890.041; 29/890.039; 228/213; 165/167
(58) Field of Search ..................... 29/890.039, 890.041, 29/527.2, 458; 228/193, 212, 213, 262.61, 262.51; 165/148, 167, 166

(56) References Cited

U.S. PATENT DOCUMENTS

| 2,961,222 A | | 11/1960 | Butt |
| 4,128,235 A | | 12/1978 | Gersbacher |
| 4,249,597 A | | 2/1981 | Carey |
| 4,520,305 A | * | 5/1985 | Cauchy ...................... 322/2 R |
| 4,807,342 A | * | 2/1989 | Lapeyre .................. 29/890.03 |
| 5,476,575 A | * | 12/1995 | Brophy et al. .............. 205/652 |
| 5,811,168 A | | 9/1998 | Kourtides |
| 6,220,497 B1 | * | 4/2001 | Benz et al. ................. 228/118 |

FOREIGN PATENT DOCUMENTS

| DE | 198 01 374 C | 3/1999 |
| EP | 0 689 023 A | 12/1995 |
| EP | 0 907 064 A | 4/1999 |
| EP | 1 094 291 A | 4/2001 |
| WO | 01 30528 A | 5/2001 |

* cited by examiner

Primary Examiner—Marc Jimenez
(74) Attorney, Agent, or Firm—Michael J. Striker

(57) ABSTRACT

A method for producing a component out of stacked plates (9, 10) soldered to one another, into at least some of which recesses (11, 12, 13) are made, is proposed, in which at least one solder layer (8) is provided between the plates (9, 10) for a solder diffusion process. According to the invention, the plates (9, 10), with solder layers (8) between them, are stacked on one another and compressed in the cold state before the solder diffusion process. With this provision, the use of complicated pressing tools in the actual solder diffusion process is avoided.

8 Claims, 2 Drawing Sheets

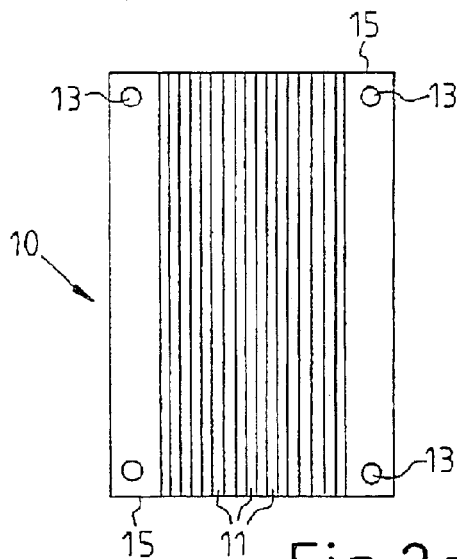
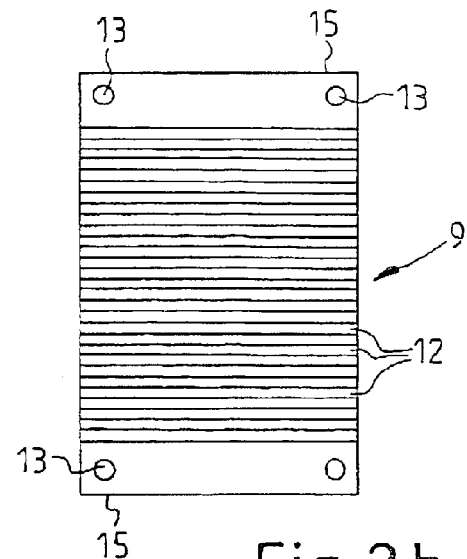
Fig. 2a  Fig. 2b
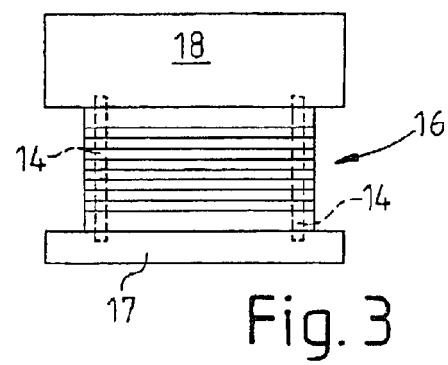
Fig. 3
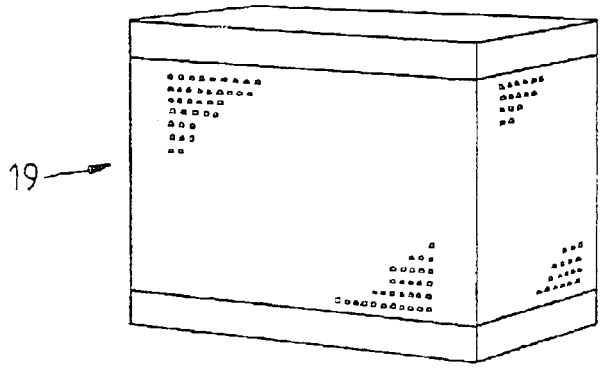
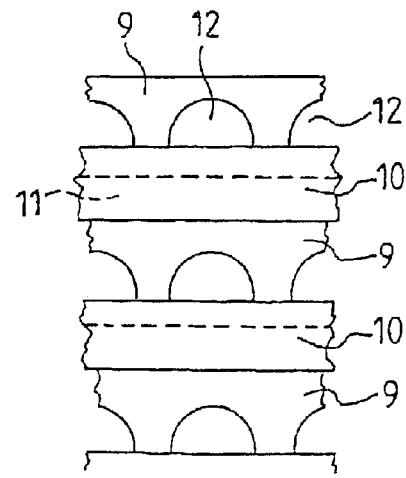
Fig. 4a  Fig. 4b

METHOD FOR PRODUCING A STRUCTURAL MEMBER FROM PLATES STACKED ON TOP OF EACH OTHER AND SOLDERED TOGETHER

BACKGROUND OF THE INVENTION

The invention relates to a method for producing a component from stacked plates soldered to one another, such as a micro-heat exchanger.

By way of example, micro-heat exchangers are suitable for use in air conditioning systems. Moreover, micro-heat exchangers can be used in cooling electronic components, for instance in power electronics.

For reducing the mass and/or volume, particularly in vehicles, there is a need for compact production of the heat exchanger. For that purpose, in some embodiments, plates in which conduits are made are put together to form complete structural parts. The conduit structures can be produced by applying material, or by removing material. In the removal type of production, suitable conduits are milled out of a material, or etched, or for instance created by laser machining. It is thus possible to produce conduit structures in which a fluid can flow. In the material-applying type of production, structures are constructed on a substrate, for instance by an electroplating step. Joining together individual plates is typically done by soldering methods. Applying terminals cannot always be taken care of in a single production operation.

From German Patent 198 01 374 C1, a method for soldering metal, microstructured sheets is disclosed. In this method, a stack is created from the sheets and from electrical terminals located between each two adjacent sheets, and with the application of pressure in a vacuum or in an inert gas atmosphere, the stack is subjected to a solder diffusion process. This is done in a suitably hermetically sealed furnace. In this operation, subjecting a stack of microstructured sheets to pressure, in particular, is comparatively complicated. This is because suitable pressing tools are heated to the soldering temperature along with the structural parts to be produced and must therefore be capable of withstanding these temperatures.

SUMMARY OF THE INVENTION

The object of the invention is to simplify the production of components of the type defined at the outset.

The invention is based on a method for producing a component out of stacked plates soldered to one another, into at least some of which recesses are made, in which method, at least one solder layer is provided between the plates for a solder diffusion process. The solder diffusion process is favorably performed in a vacuum or in an inert gas atmosphere. The nucleus of the invention is that the plates, with the at least one solder layer between them, are stacked on one another in the later disposition of the structural part, and are also compressed, preferably in the cold state, before the solder diffusion process. The invention makes use of the recognition here that a sufficiently good connection of the individual plates in the solder diffusion process can already be attained if compressing of the plates is done before the actual solder diffusion operation, which makes a comparatively strong compressing of the plates in the solder diffusion process at temperature unnecessary. Thus complicated pressing tools, which would otherwise have to withstand the high soldering temperatures, can be dispensed with.

In an especially preferred feature of the invention, the stack of plates and solder layers is made heavier by a weight, such as a steel block, during the solder diffusion operation. Because of the precompression, it is often not possible, in the solder diffusion operation itself, to dispense entirely with pressing the plates together. However, a comparatively low pressing force is already sufficient and can be furnished by a weight placed on them that would normally not suffice to apply a requisite pressure force without precompression.

In a further, especially preferred feature of the invention, the stack of plates and solder layers, for the solder diffusion process, is placed in a receptacle. By this provision, secure positioning of the stack of plates in the soldering operation is assured. Preferably, the bearing face of the receptacle is coated in such a way that connecting the surface of the receptacle to the stack of plates to be soldered is averted.

To further improve the separation between the receptacle and the stack of plates to be soldered, it is moreover proposed that a high-temperature-proof insulating material is placed between the receptacle and the stack of plates.

To prevent an already-soldered stack of plates from being damaged when terminals, for example, are attached directly in a later soldering process, it is moreover proposed that later soldering process is performed at a lower temperature than the preceding soldering process.

For rational production and to assure a secure soldered connection, it is moreover proposed that before the compacting and soldering, a solder layer, such as a bronze layer, is applied to the plates by an electrolytic method. For a later soldering process under negative-pressure conditions, care must be taken to assure that the coating have the least possible gloss, to prevent outgassing. If the coating tends to oxidize upon contact with air, then oxidation products created in the process are preferably removed before the soldering operation, for example by immersion in a suitable solution.

In another preferred feature of the invention, the plates are provided with recesses by means of a photolithographic structuring process with a later etching process, in order to make flow conduits, for instance.

BRIEF DESCRIPTION OF THE DRAWINGS

The invention is described in further detail in conjunction with the following drawings, with further advantages and details being recited.

Shown are

FIGS. 2a and 2b, in a plan view, two structured, coated plates that have gone through the process steps of FIGS. 1a–f;

FIG. 3, schematically illustrated, plates stacked on one another in a receptacle with a weight pressing on them; and FIGS. 4a and b, a micro-heat exchanger in the fully soldered state, seen in perspective, and an enlarged view thereof, respectively.

DESCRIPTION OF THE PREFERRED EMBODIMENTS

A heat exchanger comprises individual plates (metal sheets) stacked on one another and for instance comprising copper, aluminum or the like, in which conduit structures and optionally auxiliary structures for positioning are made. The thickness of the individual layers can vary over a wide range, and can the depth and width of the conduits. Depending on the production process employed, either rectangular or nonrectangular conduits are obtained.

Figure 1A:
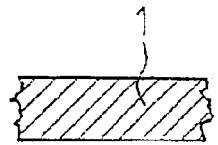
FIGS. 1a–f, the production of a structured plate, for example for a micro-heat exchanger, in individual process stages, shown in schematic sectional views.
Figure 1B:
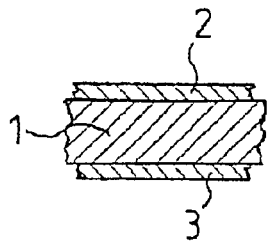
Figure 1C:
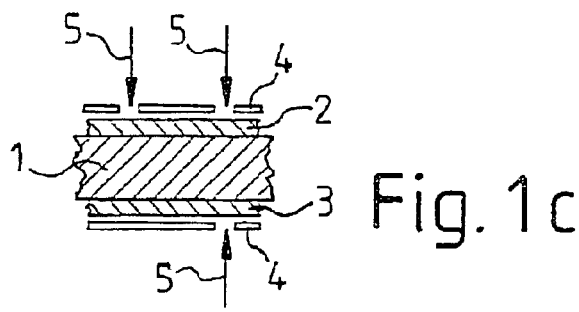
Figure 1D:
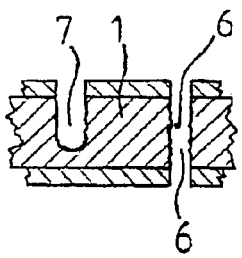

In FIGS. 1a–f, the production of structured plates, which can be stacked on one another for an ensuing solder diffusion process, is shown. Onto a substrate 1, a dry photoresist film 2, 3 is laminated onto both sides. With the aid of a mask, such as a foil mask 4, the photosensitive film 2, 3 is exposed to UV radiation (schematically represented by arrows 5). For the precision required in the production of conduit structures in general, economical foil masks and contact exposure to light are typically sufficient. The photoresist film 2, 3 exposed to light is structured in a suitable developer medium. This lays bare the regions that will later be conduits. For separating the parts, the photoresist film is applied not only to both sides of the substrate but is also exposed to light and developed on both sides, and with simultaneous etching of the top and bottom sides at opposed points 6, the substrate is severed completely (FIG. 1d). Depending on the etchant used, which for example exhibits an isotropic etching behavior, instead of rectangular contours rounded conduit cross sections 7 are created.

The etching process can be performed in various ways. In currentless etching removal of material, the metal dissolution is accomplished by a redox reaction; the metal is oxidized and dissolved in the process. This method is typically used for large substrate areas. In the present case, many individual layers for the heat exchangers to be produced are disposed side by side on the substrate. For economical production, the etching can be done in a once-through process in a spray etching system.

Figure 1E:
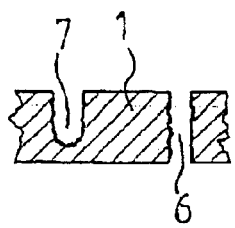

Once the etching process has been completed, the photoresist film 2, 3 is removed (FIG. 1e).

Figure 1F:
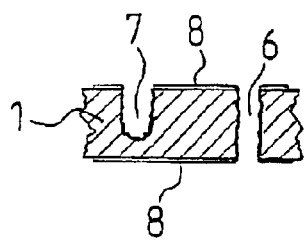

As the next machining step, an electrolytic coating is performed (FIG. 1f). For example, a bronze coating ($CuSn_6$) 8 is applied to both sides of the substrate 1.

A plan view on structured plates 9, 10 produced by the method sequence shown is provided in FIGS. 2a and b. The plates 9, 10 are rectangular, and flow conduits 11 have been etched longitudinally into the plate 10 while flow conduits 12 have been etched transversely into the plate 9, in each case on only one side. Also, by means of etching on both sides, holes 13 are made in the plates 9, 10, and by means of these holes the plates 9, 10 can be threaded in alternation and in exact positions onto guide pins 14 (see FIG. 3). Once again, the outer contour of the plates 9, 10 has been created by etching on both sides, but the plates have been held in the substrate by means of lugs 15, which prevent an undesired mechanical breakout during the individual process steps.

In FIG. 3, a stack 16 of plates 9, 10 is shown, stacked in alternation on one another between two jaws 17, 18 and threaded onto guide pins 14. By means of the upper jaw 18, the stack 16 of plates is subjected to some pressure, in order to connect the plates for the solder diffusion process. The jaw 18 accordingly serves as a contact-pressure weight. A decisive aspect for the success of the solder diffusion operation, in which the bronze coating serves as solder, is a compressing operation on the stack 14, preferably with the jaws 17 and 18, in a press, such as a hand press, in a cold state before the actual solder diffusion operation. As a result, complicated pressing tools that would otherwise have to be introduced into the furnace for soldering as well and would have to be heated there as well, are avoided. After the pressing, the stack 16 of plates along with the jaws 17, 18 can be placed in a simple way, without pressing tools, into a single chamber vacuum furnace, for instance, in which the stack of plates is heated to the soldering temperature.

After a cooling-down phase, the completely soldered stack of plates (see FIG. 4a) is taken out of the furnace again for further processing.

In FIG. 4b, an enlarged detail of the stack of plates is shown, with alternating plates 9, 10 and flow conduits 12.

What is claimed is:

1. A method for producing a component out of stacked plates (9, 10) soldered to one another, into at least some of which recesses (11, 12, 13) are made, in which method at least one solder layer (8) is provided between the plates (9, 10) for a solder diffusion process, characterized in that the plates (9, 10), with solder layers (8) between them, are stacked on one another and compressed before the solder diffusion process in such a manner that in the solder diffusion process, pressing the plates against one another can either be dispensed with entirely, or a force that is comparatively slight compared to the pressing force in a precompressing is needed; and that in the solder diffusion process, the stack of plates is subjected either to no pressing force, or to only a comparatively slight pressing force, relative to the pressing force in the precompressing.

2. The method of claim 1, wherein the stack of plates (9, 10) and solder layers (8) is made heavier by a weight during the solder diffusion operation.

3. The method of claim 1, wherein the stack of plates (9, 10) and solder layers (8), for the solder diffusion process, is placed in a receptacle (14, 17, 18).

4. The method of claim 1, wherein a high-temperature-proof insulating material is placed between parts of the receptacle and the stack (16) of the plates.

5. The method of claim 1, wherein terminals are applied, in a later soldering process in which the soldering temperature is lower than in the preceding soldering process.

6. The method of claim 1, wherein a solder layer (8) is applied to the plates (9, 10) before the compression and soldering.

7. The method of claim 1, wherein the plates (9, 10) are provided with recesses (11, 12, 13) by means of a photolithographic structuring process with a later etching process.

8. The method of claim 1, wherein the component produced is a micro-heat exchanger.

* * * * *